United States Patent [19]

Iwahashi

[11] Patent Number: 5,519,660
[45] Date of Patent: May 21, 1996

[54] SEMICONDUCTOR MEMORY DEVICE

[75] Inventor: Hiroshi Iwahashi, Yokohama, Japan

[73] Assignee: Kabushiki Kaisha Toshiba, Kanagawa, Japan

[21] Appl. No.: 235,376

[22] Filed: Apr. 29, 1994

[30] Foreign Application Priority Data

Apr. 30, 1993 [JP] Japan ................................. 5-104619

[51] Int. Cl.$^6$ ...................................................... G11C 7/00
[52] U.S. Cl. ................ 365/203; 365/189.01; 365/230.03
[58] Field of Search ................................ 365/203, 189.01, 365/230.03, 189.09

[56] References Cited

U.S. PATENT DOCUMENTS

| | | | |
|---|---|---|---|
| 4,658,381 | 4/1987 | Reed et al. | 365/203 |
| 4,954,987 | 9/1990 | Auvinen et al. | 365/189.02 |
| 5,228,003 | 7/1993 | Tokuda | 365/203 X |
| 5,309,401 | 5/1994 | Suzuki et al. | 365/203 |
| 5,313,434 | 5/1994 | Abe | 365/203 X |

OTHER PUBLICATIONS

Cuppens, Roger, et al., "A 256 kbit ROM With Serial ROM Cell Structure", IEEE Journal of Solid–State Circuits, vol. SC–18, No. 3, Jun. 1983, pp. 340–344.

*Primary Examiner*—David C. Nelms
*Assistant Examiner*—Son Dinh
*Attorney, Agent, or Firm*—Loeb and Loeb

[57] ABSTRACT

There is disclosed a semiconductor memory device which can decrease precharge current and stably read out data, e.g., EEPROM, etc., having column line potential setting transistors connected between precharging transistors and their corresponding column lines. The column line potential setting transistor maintains precharging potential of the column line to a low value for suppressing instantaneous current by precharging to a low value and in a read cycle after precharge it further lowers the gate potential applied to the gate of the column line potential setting transistors to a value lower than a potential of the gate for the precharge period thereby prevent an erroneous operation by the capacitive coupling between column lines.

8 Claims, 5 Drawing Sheets

FIG. 4A  $\phi 1$

FIG. 4B  $\phi 21$

FIG. 4C  $\phi 22$

FIG. 4D  $\phi 31$

FIG. 4E  $\phi 32$

FIG. 10A S :
FIG. 10B WL1 :
FIG. 10C WLn :
FIG. 10D φ :
FIG. 10E BL1 :
FIG. 10F BL2 :

SEMICONDUCTOR MEMORY DEVICE

BACKGROUND OF THE INVENTION

1. Field of the Invention

This invention relates to a semiconductor memory device, and more particularly to an EEPROM (Electrically Erasable Programmable ROM) having memory cells of NAND structure in which data readout speed is improved.

2. Description of the Prior Art

Figure 8:
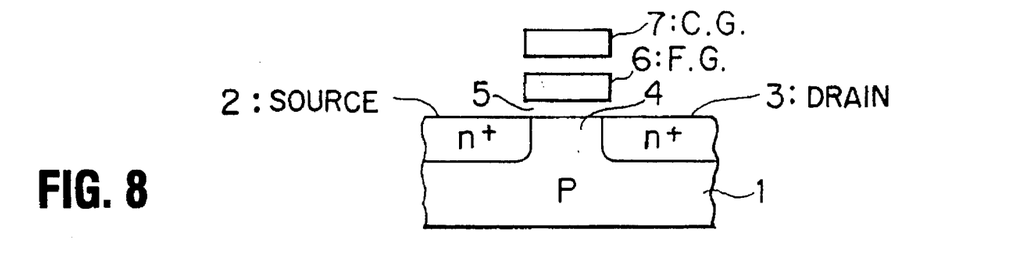
FIG. 8 is a cross sectional view showing the configuration of a typical memory cell of EEPROM of the NAND type.

An example of the configuration of a memory cell of the NAND type EEPROM is shown in FIG. 8. Source region 2 and drain region 3 which are n-type impurity regions are formed in the surface of p-type semiconductor substrate 1, and channel region 4 is formed between the drain 3 and the source 2. Floating gate (FG) 6 is formed above the channel 4. Gate insulation film 5 is formed between the channel 4 and the floating gate 6. Furthermore, control gate (CG) 7 is formed above the floating gate 6. An insulating film is formed between the floating gate 6 and the control gate 7. The gate insulating film 5 has a thickness sufficient to allow an electron tunnel effect to occur between the channel region 4 and the floating gate 6.

In such a memory cell, data write operation will be carried out as follows. One of binary data is written by emitting electrons from the floating gate 6 to the semiconductor substrate 1. In order to emit electrons from the floating gate, the control gate 7 is set to zero volts and the substrate 1 is set to a high voltage. Electrons are emitted from the floating gate 6 into the substrate 1 through the gate insulating film 5 by using the tunnel effect. The other of binary data is written by injecting electrons into the floating gate 6 from the substrate 1. In order to inject electrons into the floating gate 6, the substrate 1, the source 2 and the drain 3 are set to zero volts, and the control gate 7 is set to a high voltage. Consequently, electrons are injected into the floating gate 6.

Figure 9:
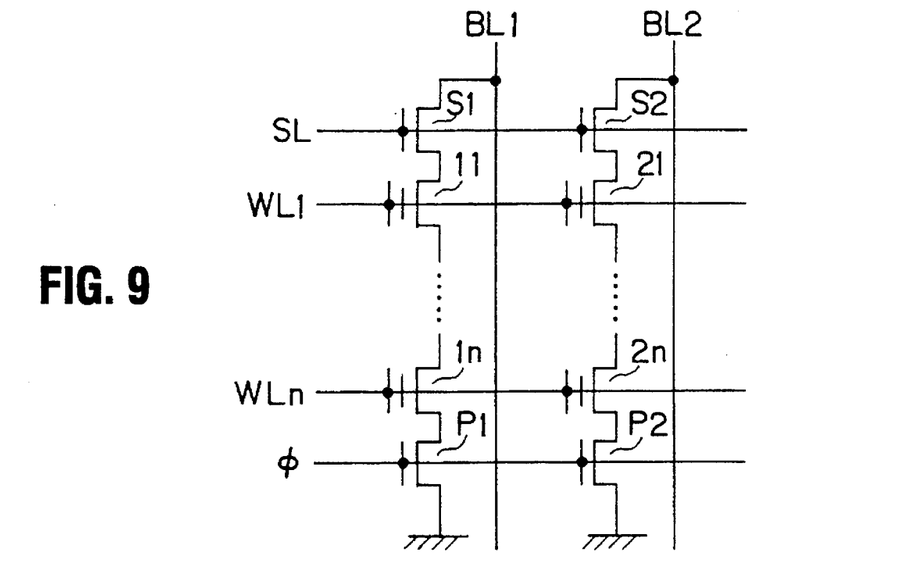
FIG. 9 is a circuit diagram showing the configuration of a typical memory cell array conventionally used.
Figures 10A, 10B, 10C:
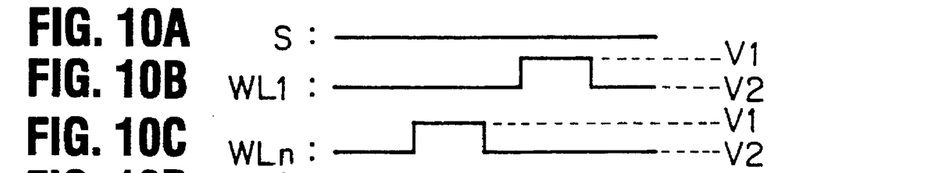
FIGS. 10A–10F are waveform diagrams showing the operation of the conventional non-volatile semiconductor memory shown in FIG. 9.
Figures 10D, 10E, 10F:
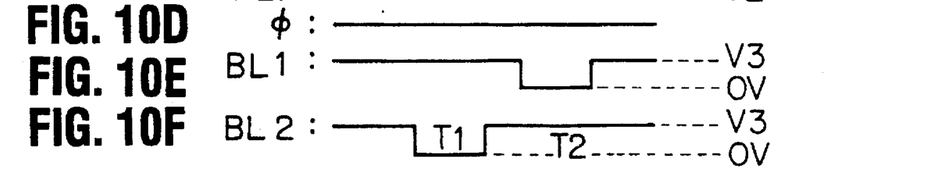

A portion of a semiconductor memory device constructed as an integrated circuit in which a plurality of memory cells as mentioned above are connected in a matrix form is shown in FIG. 9.

This semiconductor memory device includes memory cell array in which memory cell blocks are arranged in a matrix form. Each of the memory cell blocks includes a select transistor(S1), memory cells(11–1n) and a transistor(P1). Respective memory cell blocks are selectively connected to column lines (bit lines) BL1–BL2 by select transistors S1, S2 provided between the column lines and the respective memory cells. Moreover, transistors P1, P2 for providing a reference potential to the memory cell blocks are also connected between the respective memory cells and a reference potential. The gates of select transistors S1, S2 in the same row are commonly connected to a select line. Select signal SL is applied to the select line. Further, the gates of the transistors P1, P2 are also commonly connected and are controlled by signal φ. In addition, the gates of the memory cells in the same rows are commonly connected to one of the row lines (word lines) WL1–WLn.

The operation in the configuration shown in FIG. 9 will now be described with reference to FIGS. 10A–10F which is the voltage waveforms of respective nodes.

In the case of programming data into a memory cell, all row lines WL1–WLn connected to control gates 7 are set to zero volts and the substrate 1 is set to a high voltage to thereby discharge electrons from the floating gates of all memory cells into the substrate. Then, a select signal of a high potential is applied to the gate of the select transistor of the memory cell block including the memory cell into which data is to be written. At the same time, signal φ is set zero volts to allow transistors P1, P2 to be turned OFF, thus to separate the memory cell from the reference potential.

Further, in the case of injecting electrons into the floating gate of the memory cell, the corresponding row line WL is set to high potential V1 and the corresponding column line BL is set to zero volts. At this time, a potential difference between the floating gate and the substrate becomes a sufficient value to allow an electron tunnel effect to occur between the floating gate and the substrate. Thus, electrons are injected from the substrate into the floating gate.

On the other hand, the row line WL which is not selected is set to a potential of V2 lower than the potential V1. At this time, even if a potential of the column line is zero volts, since the potential V2 is lower, a potential difference between the floating gate and the substrate does not become a sufficient value such that the tunnel effect occurs, so no electron is injected into the floating gate of the memory cell which is not selected. When electrons are not injected into the floating gate of the selected memory cell which is connected to the selected row line, a potential of the column line BL is set to a potential of V3. A potential difference between the floating gate of the memory cell and the substrate (the channel region of the memory cell) does not become a sufficient value to allow the electron tunnel effect to occur between the floating gate and the substrate, even if the potential of the row line WL is the high potential V1. Consequently, no electron is injected into the floating gate of the memory cell when the potential V3 is applied to the selected column line. In FIGS. 10A–10F, the row lines WL1 and WLn are the potentials V2 and V1 respectively at time period T1, electrons are injected into the floating gate of memory cell 2n since the column line BL2 is zero volts, but no electron is injected into the floating gate of memory cell 1n since the column line BL1 is the potential V3. Similarly, the row lines WL1 and WLn are the potentials V1 and V2 respectively at time period T2, electrons are injected into the floating gate of memory cell 11 since the column line BL1 is zero volts, but no electron is injected into the floating gate of memory cell 21 since the column line BL2 is the potential V3.

As stated above, electrons are emitted from the floating gates of all memory cells first. Consequently, the threshold voltages of the memory cells change to a negative value. One of binary data is programmed into the memory cells by emitting electrons from the floating gate. And then, electrons are selectively injected into the floating gate of the memory cell. Consequently, the threshold voltage of the memory cell into which electrons are injected changes to a positive value. The other data of the binary data is selectively programmed by injecting electrons into the floating gate.

When the data stored in the memory cell is read, a selected row line is set to a logic "0" level, e.g., 0 volts, and non-selected row lines are set to a logic "1" level, e.g., 5 volts. Memory cells connected to the non-selected row lines are turned ON even if electrons are injected into the floating gate of the memory cell, because the non-selected row line is a logic "1". However, since the selected row line is 0 volts, the selected memory cell is turned OFF if the threshold voltage of the memory cell is positive, but if the threshold voltage of the selected memory cell is negative, the memory cell is turned ON.

Accordingly, it is possible to detect whether data stored in the memory cell is a logic "1" level or a logic "0" level according to whether the selected memory cell is turned ON or OFF.

With such readout method, since the threshold voltage of the memory cell where electrons are injected into the floating gate must be set so that the memory cell is turned ON when it is in the non-selected state and that memory cell is turned OFF when it is selected, the quantity of electrons injected should be carefully be controlled.

For this reason, the injecting electrons into the memory cell and the reading data from the memory cell for checking the quantity of electrons injected are performed repeatedly, thus to stop injection of electrons when the quantity of electrons injected is equal to a suitable value. However, since electrons are injected through an extremely thin gate insulating film, the threshold voltages of the memory cells after the injection of electrons do not become uniform, and vary according to a certain distribution owing to subtle variations of thickness of the gate insulating film and a manufacturing process. For this reason, quantities of electrons injected into the floating gates in respective memory cells become diverse.

As stated above, generally, the threshold voltage of the memory cell into which electrons are injected varies within a certain range. Accordingly, a difference between a threshold voltage value of the memory cell having the lowest threshold voltage and a threshold voltage value of the memory cell having the highest threshold voltage results in a difference between currents flowing in these memory cells, so readout speed of data from a selected memory cell varies for different memory cells. Since data is detected by a current flowing through non-selected memory cells connected in series, unevenness between threshold voltages of non-selective memory cells results in unevenness between currents flowing in memory cells as it is, and further results in unevenness of data readout speed.

For the purpose of increasing data readout speed, it is desirable that a quantity of current flowing in the memory cell is made larger. However, since the threshold voltage of the memory cell into which electrons are injected must be positive, even if the threshold voltage of the memory cell having the lowest threshold voltage is set to a value slightly higher than zero volts, the value of the threshold voltage of the memory cell having the highest threshold voltage would be a value far higher than zero volts by unevenness of the distribution of threshold voltages of the memory cells. Thus, a current flowing in the memory cell having the highest threshold voltage becomes a small value, so it takes much time for reading out data.

For this reason, there is conventionally proposed a technique. Data are read at a time from all memory cells connected to a selected one row line WL. The data read from the memory cells of one row line are latched in latch circuits. And the data of the latch circuits are sequentially read out. When such technique is employed, it takes much time in readout from the first selected memory cell, but the data from the next memory cells can read in a short time in continuous addresses. Consequently, overall data readout time can be reduced, thus making it possible to read out data at a high speed.

In such a technique, since a current flowing in the memory cell is extremely small, readout of data has been carried out by precharging respective column lines thereafter to detect whether the column line is discharged by the memory cell or remains charged without being discharged. In this case, since the charge path to the column line is lost after the column line is precharged, the column line is rapidly discharged by the memory cell after the precharge of the column line is completed. And it is possible to satisfactorily ensure the low potential level of the column line even if a current flowing in the memory cell is small.

However, since such charge operation has been conventionally carried out so that a charge potential reaches a power supply potential, a current required for charging all column lines has been instantaneously extremely large. For allowing the readout speed to be high, it is necessary to carry out precharge in a short time. For this reason, an instantaneous peak current at the time of carrying out precharge has been extremely large. With the progress of the miniaturization technology of the semiconductor integrated circuit, the spacing between column lines has been become smaller and smaller. As a result, the capacitive coupling between column lines has not been negligible. In the conventional precharging method as described above, there is no charge path after precharge is completed. For this reason, a column line to which a selected memory cell which remains in OFF state is connected is placed in a electrically floating state after precharge is completed. On the other hand, a column line to which a selected memory cell which remains in ON state is connected is discharged by the memory cell in ON state. As a result, a potential of the column line gradually lowers. When a column line to which a memory cell in ON state is connected and a column line to which a memory cell in OFF state is connected so that the column line is in an electrically floating state are adjacent to each other, a potential of the column line to which the memory cell in OFF state is connected drops followed by potential drop of the column line connected to the memory cell in ON state by capacitive coupling between the two column lines. With the progress of miniaturization, the coupling capacitance between column lines increasingly has become large, and the potential drop of a column line in the electrically floating state also increasingly become large. For this reason, the potential of the column line which is precharged drops, so any erroneous operation may take place.

SUMMARY OF THE INVENTION

With the above problems in mind, an object of this invention is to provide a semiconductor memory device which permits a current required for precharging respective column lines to be lesser than that in the prior art, and which can stably read out data, and a readout method for the semiconductor memory.

According to one aspect of the present invention, there is provided a semiconductor memory device comprising:

a memory cell array having memory cells arranged in a matrix form;

row lines connected to the memory cells belonging to the same rows;

column lines connected the memory cells belonging to the same columns;

precharge means for precharging the column lines, connected to the column lines, the precharge means including column line potential setting transistors provided between a potential supply terminal and the column lines for adapting to set potentials of the column lines to a predetermined value when the column lines are precharged; and gate potential setting means for setting, after completion of the precharge, potential of the gates of the column line potential setting transistors to a value lower than the potential for a precharge period.

According to another aspect of the present invention, there is provided a semiconductor memory device comprising:

a memory cell array having memory cells arranged in a matrix form;

row lines connected to the memory cells belonging to the same rows;

column lines connected the memory cells belonging to the same columns;

precharge means for precharging the column lines, connected to the column lines, the precharge means including first column line potential setting transistors and second column line potential setting transistors, the first column line potential setting transistors provided between a potential supply terminal and the column lines of odd columns and adapted to set potentials of the odd column lines to a predetermined value in response to a first control signal when the odd column lines are precharged, the second column line potential setting transistors provided between the potential supply terminal and the column lines of even columns and adapted to set potentials of the even column lines to the predetermined value in response to a second control signal when the even column lines are precharged; and gate potential setting means for setting, after completion of the precharge of the odd column lines, potential applied to gates of the column line potential setting transistors of the odd columns to a value lower than the potential for the precharge, and for setting, after completion of the precharge of the even column lines, potential applied to gates of the column line potential setting transistors of the even columns to the value lower than the potential for the precharge.

In the semiconductor memory device according to this invention, column line potential control transistors capable of controlling a potential of the column line are inserted between transistors for charging respective column lines and the column lines. When the column line is precharged, the potential of the column line is controlled by the potential of the gate of the column line potential control transistor. The column line is charged to a low potential to thereby hold an instantaneous current by precharge of the column line down to a small value. A potential of the gate of the column line potential control transistor is set at a potential lower than that at the time of precharge, after precharge is completed. So, a potential of a potential detecting point of the column line for reading data of the memory cell is not fluctuated even if a drop of the potential of the column line by the capacitive coupling between column line takes place, thus to prevent occurrence of an erroneous operation.

BRIEF DESCRIPTION OF THE DRAWINGS

In the accompanying drawings:

FIGS. 6 4A–4E are waveform diagrams showing the operation in the configuration of FIG. 5;

DESCRIPTION OF THE PREFERRED EMBODIMENTS

Figure 7:
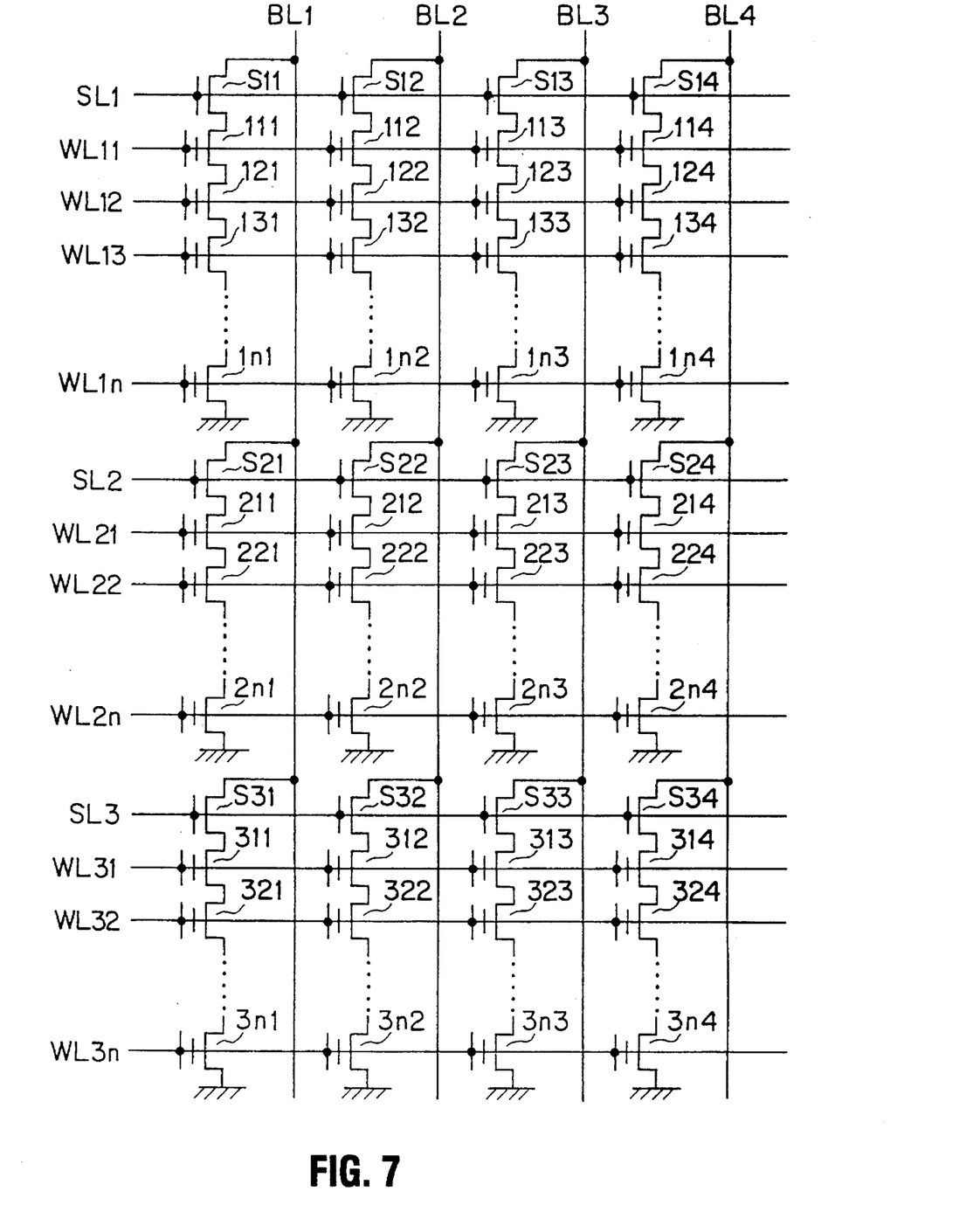
FIG. 7 is a circuit diagram showing the configuration of a memory cell array to which this invention is applied.

A preferred embodiment of this invention will now be described with reference to the attached drawings. FIG. 7 is a circuit diagram showing the configuration of a memory cell array to which this invention is applied. This circuit is of a structure including memory cell blocks arranged in a matrix form. In respective memory blocks, memory cells (111–1n1, . . . , 314–3n4) are respectively connected in series, and are connected to corresponding column lines BL1, BL2, BL3, BL4 through select transistors S11–S14, S21–S24, S31–S34, respectively. Furthermore, gates of memory cells belonging to the same rows are respectively commonly connected to row lines WL1–WL14, WL21–WL24, WL31–WL34. As stated above, the configuration of the memory cell is essentially the same as that shown in FIG. 9, but illustration is made with transistors (P1, P2) between memory cell transistors and the reference potential being omitted.

Figure 1:
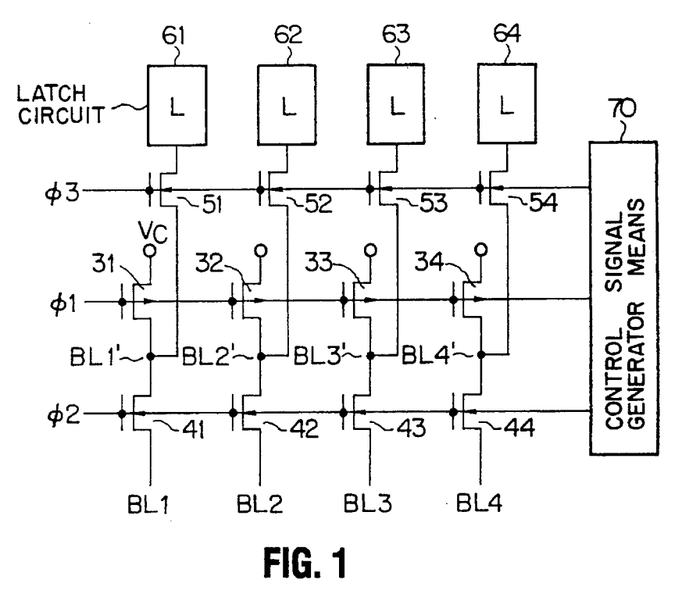
FIG. 1 is a circuit diagram showing the configuration of an embodiment of a semiconductor memory device according to this invention.

FIG. 1 is a circuit diagram showing the configuration for charging respective column lines connected to column lines BL1, BL2, BL3, BL4 of FIG. 7.

Respective column lines are connected to power supply Vc through series connection circuits of P-channel enhancement type transistors 31–34 controlled by signal $\phi 1$ and N-channel enhancement type transistors 41–44 controlled by signal $\phi 2$. The P-channel enhancement type transistors 31–34 serve to charge column lines, i.e., are turned ON when signal $\phi 1$ changes to a logic "0" level to charge the column line. Further, the N-channel enhancement type transistors 41–44 are turned ON when signal $\phi 2$ changes to a logic "1" level to charge column line BL to a potential obtained by subtracting its threshold voltage from the gate potential. Accordingly, a charge potential of the column line can be arbitrary determined by the potential of signal $\phi 2$ and threshold voltages of the transistors 41–44 when the column line is charged.

BL1'–BL4' are the connecting nodes of the transistors 31–34 and the transistors 41–44 respectively. The BL1'–BL4' are respectively connected to latch circuits 61–64 through N-channel enhancement type transistors 51–54 controlled by signal $\phi 3$.

It is to be noted that signals $\phi 1$, $\phi 2$, $\phi 3$ are signals for readout of data, and are signals which are irrelevant to signal $\phi$ of FIG. 9. In addition, the signals $\phi 1$, $\phi 2$, $\phi 3$ are generated at control signal generator means 70.

Figure 2A:
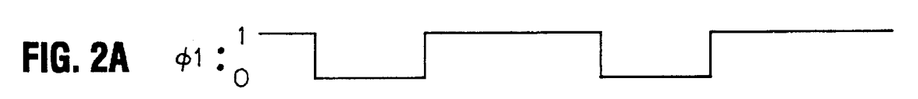
FIGS. 2A–2E are waveform diagrams showing the operation in the configuration of FIG. 1.
Figure 2B:
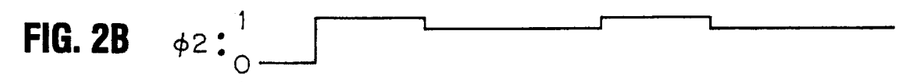
Figures 2C, 2D, 2E:
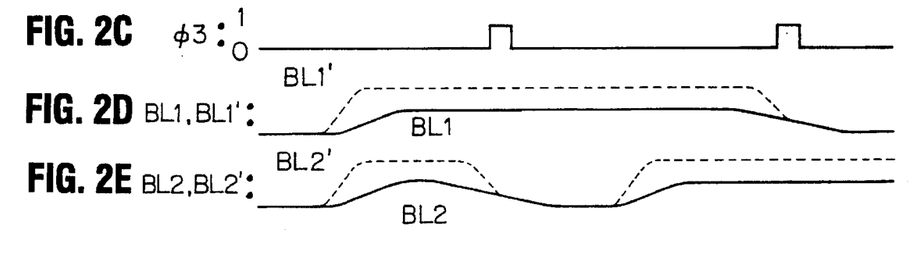

FIGS. 2A–2E are waveform diagrams showing voltage waveforms at respective internal nodes in FIG. 1, and the operation in FIG. 1 will now be described with reference to FIGS. 2A–2E.

when the column line is precharged, the signals $\phi 1$, $\phi 2$ change to a logic "0" and a logic "1", respectively. By doing so, e.g., the column line BL1 is charged to a potential obtained by subtracting the threshold voltage from a potential of the gate of the transistor 41 as previously described, and the node BL1' of the transistor 41 and the transistor 31 is charged to power supply voltage VC. This node BL1' is rapidly charged because parasitic capacitance is small. However, since many memory cells are connected to the column line BL1, the parasitic capacitance is large. As a result, charge operation is gently carried out. After the precharge is completed, the signal φ1 changes to a logic "1" level so that the transistor 31 is turned OFF. On the other hand, the signal φ2 remains at a logic "1" level, but the potential of the signal φ2 is caused to be lower by a predetermined value than that at the time of the precharge of the column line as shown in FIG. 2B. Thus, since the potential value of the column line is higher than a value obtained by subtracting the threshold voltage from the gate potential of the transistor 41, the transistor 41 is also placed in OFF state.

Various circuits for outputting signal φ2 are conceivable. For example, when there is used a circuit of a structure such that two drive transistors having a threshold voltage identical to that of the transistor 41 and having a gate and a drain which are connected to each other are connected in series between a load transistor serving as a load connected to power supply voltage VC and a reference potential to suitably set conduction resistance values of respective transistors, a signal having a voltage value twice larger than the threshold voltage of transistor 41 is obtained as logic "1" level of signal φ2. Thus, the column line is precharged to a voltage value identical to the threshold voltage of the transistor 41. And a discharge transistor is connected in parallel to the two drive transistors. when the discharge transistor is turned ON after the precharge of the column line is completed, the signal φ2 of a logic "1" level of which voltage is lowered by a predetermined voltage, which is determined by a ratio between conduction resistance of the load transistor and the discharge transistor is obtained at the connecting node of the load transistor and the discharge transistor.

It is now assumed that a selected memory cell connected to the column line BL1 is in OFF state and a selected memory cell connected to the column line BL2 is in ON state. The column line BL1 and the node BL1' maintain a potential when they are precharged because there is no discharge path, but the column line BL2 and the node BL2' are discharged by the memory cell. First, a potential of the column line BL2 is gradually discharged. When the potential of the column line BL2 is less than a value obtained by subtracting the threshold voltage from the gate potential of the transistor 42, the transistor 42 is turned ON, so the node BL2' is also discharged. Thereafter, when signal φ3 changed to a logic "1" level, the N-channel enhancement type transistors 51, 52 are turned ON. Consequently, the latch circuits 61, 62 detect the potentials of the nodes BL1', BL2' to thereby detect that the selected memory cell connected to column line BL1 is in OFF state and a selected memory cell connected to column line BL2 is in ON state, thus to store the detected result.

In this embodiment, since charge potential of the column line is held down to a lower potential by transistors 41–44, an instantaneous peak current at the time of precharge can be a small value. Further, since the potential of the signal φ2 is lowered by a predetermined value after precharge is completed to allow the transistors 41–44 to be turned OFF, even if the potential of the column line is lowered by capacitive coupling between column lines, there is no possibility that the transistors 41–44 may be turned ON unless that the potential is caused to be greatly lower than the above-mentioned predetermined value. Accordingly, there is no influence on the potential at the node BL', at which data of memory cell detected by the latch circuits 61–64 are read out. Thus, occurrence of an erroneous operation is prevented.

Further, since a potential amplitude at the connecting node of the precharge transistor (the transistors 31–34) and the column line potential control transistor (the transistors 41–44), which is the detecting point of the data stored in the memory cell, does not undergo influence of the potential of the column line, this potential amplitude is permitted to be large. Thus, the margin of data detection is also increased.

Figure 3:
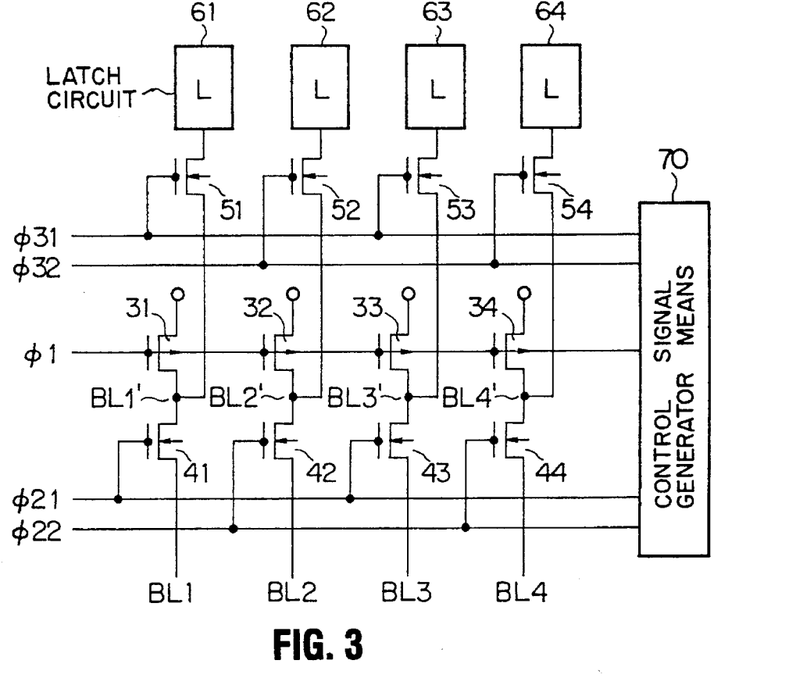
FIG. 3 is a circuit diagram showing the configuration of another embodiment of a semiconductor memory device according to this invention.
Figure 4A:
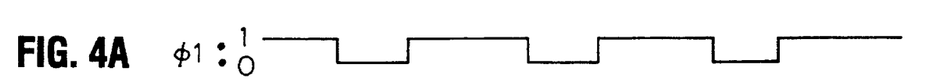
FIG. 4A–4E are waveform diagrams showing the operation in the configuration of FIG. 3.
Figure 4B:
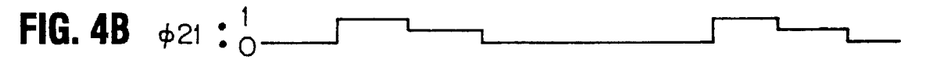
Figure 4C:
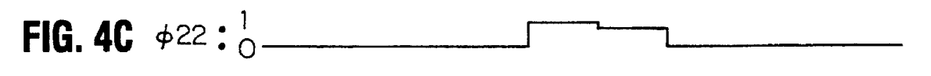
Figure 4D:
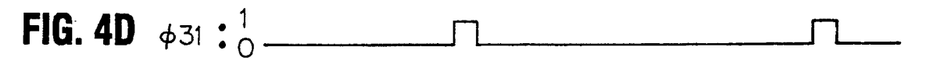
Figure 4E:
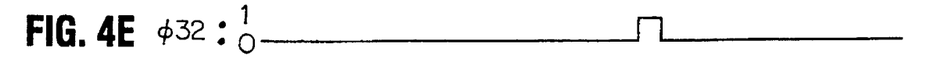

Another embodiment of this invention will now be described with reference to FIG. 3 which is the circuit configuration diagram and FIGS. 4A–4B which are the waveform diagrams showing signal waveforms at respective portions of FIG. 3. In FIG. 3, the same reference numerals are respectively attached to the same elements as those of FIG. 1, and their detailed explanation is omitted. In this embodiment, signal φ2 in the configuration of FIG. 1 is divided into two systems of φ21, φ22. Similarly, signal φ3 is divided into two systems of φ31, φ32. These signals are supplied to gates of transistors 41–44 and 51–54 one after another every adjacent column lines. Thus, adjacent column lines are controlled by different signals. For example, the column line BL1 and the node BL1' are respectively controlled by signals φ21, φ31, and the column line BL2 and the node BL2' are respectively controlled by signals φ22, φ32. When the data is read from the memory cell connected to the column line BL1, the data in not read from the memory cell connected to the column line BL2. For this reason, at column lines adjacent to a column line precharged and adapted so that data is read out therefrom, no readout operation of data is carried out. Accordingly, there is no possibility that adjacent column lines may interfere with each other, so any erroneous operation based on the capacitive coupling by adjacent column lines as in the prior art does not take place.

Figure 5:
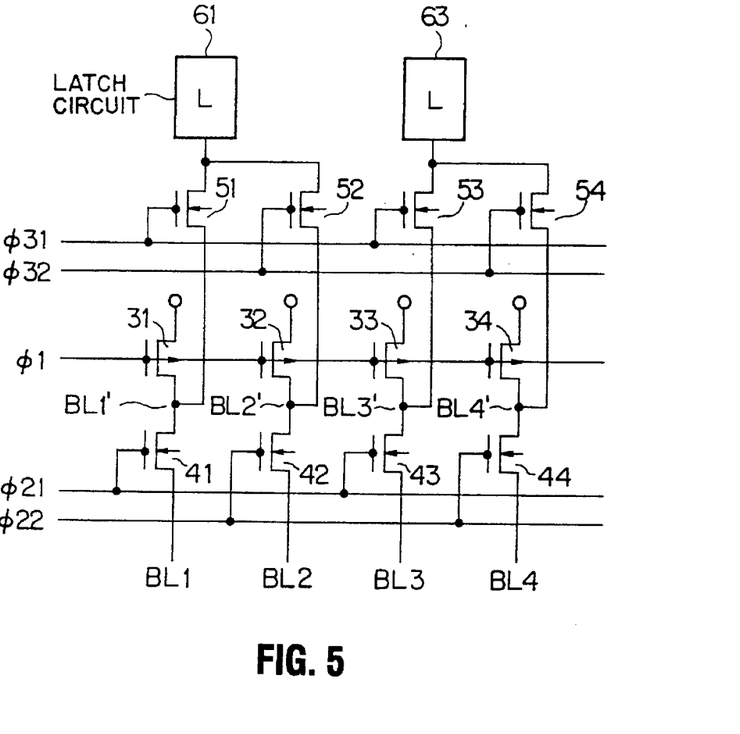
FIG. 5 is a circuit diagram showing the configuration of a further embodiment of a semiconductor memory device according to this invention.
Figures 6A, 6B:
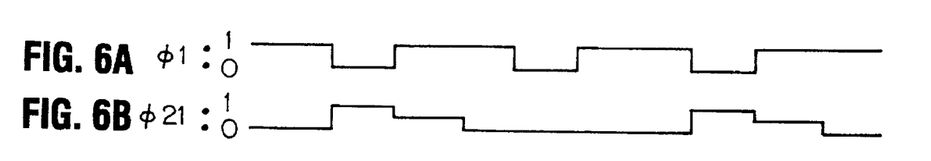
Figure 6C:
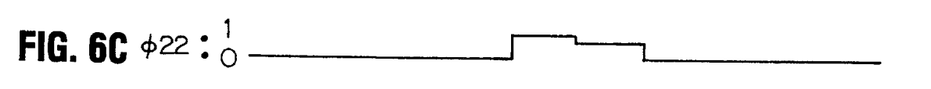
Figure 6D:
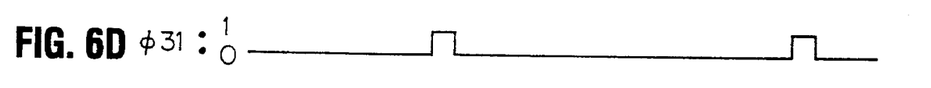
Figure 6E:
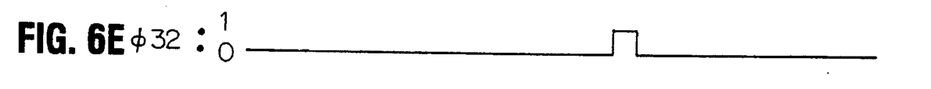

FIGS. 5 and 6A–6E show a further embodiment according to this invention. FIG. 5 is a circuit configuration diagram, and FIGS. 6 are waveform diagrams showing signal waveforms of respective portions. In this embodiment, signal φ3 of FIG. 1 is divided into two systems of φ31, φ32 similarly to the embodiment shown in FIG. 3, and one latch circuit is commonly used for respective adjacent column lines.

Since signal φ3 is delivered to adjacent column lines in the state divided into two systems φ31, φ32, timings at which transistors 51, 52 relating to adjacent column lines are tuned ON become diverse. In the embodiment shown in the FIG. 3, for example, when the transistor 51 is turned on and the latch circuit 61 detects the potential of the node BL1', the transistor 52 is not turned on, so the latch circuit is not connected to the node BL2'. As a result, it is possible to use the latch circuit commonly for adjacent column lines. In this embodiment, the number of latch circuits can be reduced. Thus, the space efficiency can be improved.

Moreover, an approach may be employed to allow all row lines to be at a logic "0" level, e.g., 0 volts in the beginning, and to allow non-selective row lines to be at a logic "1" level after charge of the column line is completed. Further, an approach may be also employed to make a setting such that the row line has a predetermined logic level to allow the select transistor to be turned ON after charge of the column line is completed. Of course, an approach may be employed to allow the row line and the select transistor to have a predetermined logic level from the first thereafter to carry out precharge of the column line. Various applications may be made.

While explanation has been given in the above-described embodiments by taking the example of the non-volatile-semiconductor memory device of the NAND type where a MOS transistor having a floating gate is used as a memory cell, it should be noted that this invention is fundamentally directed to a data readout method at the time of precharging column lines. Accordingly, in addition to the above, this invention can be applied to any memory adapted to precharge column lines.

As explained above, since transistors for controlling potentials of column lines are provided between transistors for precharging the column lines and the column lines, peak current at the time of precharge can be reduced. Further, since potential of the column line is held, by this transistor, down to a predetermined value after precharge is completed, it is also possible to prevent an erroneous operation by the capacitive coupling between column lines.

In addition, since potential amplitude at the detecting point of the data stored in the memory cell is permitted to be large, the margin of data detection is also increased.

What is claimed is:

1. A semiconductor memory device comprising:

a memory cell array having memory cells arranged in a matrix of rows and columns;

row lines connected to the memory cells belonging to the same rows;

column lines connected the memory cells belonging to the same columns;

precharge means for precharging the column lines, the precharge means including column line potential setting transistors provided between a potential supply terminal and the column lines, the column line potential setting transistors for setting potentials of the column lines to a predetermined value during a precharge operation; and control signal generator means for providing signals to gates of the column line potential setting transistors, wherein after completion of the precharge operation, the control signal generator means provides a first signal to the gates of the column line potential setting transistors of a level which is lower than a signal level provided to the gates of the column line potential setting transistors during the precharge operation, wherein the level of the first signal turns off the column line potential setting transistors.

2. The semiconductor memory device as set forth in claim 1, wherein an column line potential setting transistors are of the enhancement type.

3. The semiconductor memory as set forth in claim 1, wherein neighboring column lines have alternate precharge periods.

4. A semiconductor memory device comprising:

a memory cell array having memory cells arranged in a matrix of rows and columns;

row lines connected to the memory cells belonging to the same rows;

column lines connected to the memory cells belonging to the same columns;

precharge means for precharging the column lines, the precharge means including first column line potential setting transistors and second column line potential setting transistors, the first column line potential setting transistors provided between a potential supply terminal and the column lines of odd columns and adapted to set potentials of the odd column lines to a predetermined value in response to a first control signal when the odd column lines are precharged, the second column line potential setting transistors provided between the potential supply terminal and the column lines of even columns and adapted to set potentials of the even column lines to the predetermined value in response to a second control signal when the even column lines are precharged; and control signal generator means for providing signals to gates of the first and second column line potential setting transistors, wherein after completion of the precharge of the odd column lines, the control signal generator means provides a first signal to the gates of the first column line potential setting transistors of a first level which is lower than a signal level provided to the gates of the first column line potential setting transistors when the odd columns are precharged, wherein the first level of the first signal turns off the first column line potential setting transistors, and wherein after completion of the precharge of the even column lines, the control signal generator means provides a second signal to the gates of the second column line potential setting transistors of a second level which is lower than a signal level provided to the gates of the second column line potential setting transistors when the even columns are precharged, wherein the second level of the second signal turns off the second column line potential setting transistors.

5. The semiconductor memory device as set forth in claim 4, wherein the column line potential setting transistors are of an enhancement type.

6. The semiconductor memory as set forth in claim 4, wherein neighboring column lines have alternate precharge periods.

7. The invention of claim 1 wherein the level of the first signal provided to the gates of the column line potential setting transistors and the signal level applied provided to the gates of the column line potential setting transistors during the precharge operation both correspond to a logic "1" level.

8. The invention of claim 1 wherein the level of the first signal provided to the gates of the first column line potential setting transistors and the signal level applied provided to the gates of the first column line potential setting transistors during the precharge operation both correspond to a logic "1" level.

* * * * *